United States Patent
Deleonibus et al.

(10) Patent No.: US 6,562,687 B1
(45) Date of Patent: May 13, 2003

(54) MIS TRANSISTOR AND METHOD FOR MAKING SAME ON A SEMICONDUCTOR SUBSTRATE

(75) Inventors: Simon Deleonibus, Claix (FR); Georges Guegan, Seyssing (FR); Christian Caillat, Saint Egreve (FR); Fabien Coudert, Saint Martin d'Heres (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/869,368

(22) PCT Filed: Jan. 13, 2000

(86) PCT No.: PCT/FR00/00058

§ 371 (c)(1),
(2), (4) Date: Jun. 21, 2001

(87) PCT Pub. No.: WO00/42647

PCT Pub. Date: Jul. 20, 2000

(30) Foreign Application Priority Data

Jan. 15, 1999 (FR) .............................. 99 00389

(51) Int. Cl.⁷ .......................................... H01L 21/336
(52) U.S. Cl. ................ 438/303; 438/287; 438/294; 438/302
(58) Field of Search .................. 438/303, 302, 438/299, 287

(56) References Cited

U.S. PATENT DOCUMENTS

| | | | |
|---|---|---|---|
| 5,576,227 A | | 11/1996 | Hsu |
| 5,668,021 A | | 9/1997 | Subramanian et al. |
| 5,750,430 A | | 5/1998 | Son |
| 5,773,348 A | | 6/1998 | Wu |
| 6,352,885 B1 | * | 5/2000 | Wieczorek et al. .......... 438/197 |
| 6,162,710 A | * | 12/2000 | Ito et al. ..................... 438/528 |
| 6,346,450 B1 | * | 2/2002 | Delconibus et al. ......... 438/305 |

FOREIGN PATENT DOCUMENTS

| | | |
|---|---|---|
| DE | 4208537 | 11/1992 |
| EP | 0768715 | 4/1997 |
| FR | 2 757 312 | 12/1996 |

OTHER PUBLICATIONS

Deleonibus, et al., "Sealing Silicon Nitride Removal in SILO Field Isolation for Submicron Technologies" Dec. 1991, 4 pages.

\* cited by examiner

Primary Examiner—David Nelms
Assistant Examiner—Reneé R. Berry
(74) Attorney, Agent, or Firm—Thelen Reid & Priest LLP; Robert E. Krebs

(57) ABSTRACT

The invention relates to an MIS transistor comprising a channel region (118), source (114) and drain (116) regions arranged on either side of the channel, and a gate (150) set closely above the channel region. According to the invention, the channel has a doped central part (140), located between the source and drain regions, and separated from said source and drain regions.

7 Claims, 6 Drawing Sheets

MIS TRANSISTOR AND METHOD FOR MAKING SAME ON A SEMICONDUCTOR SUBSTRATE

This application is a national of PCT/FR00/00058 and International Application No. 99 00389, which was filed on Jan. 15, 1999, and was not published in English.

TECHNICAL FIELD

The present invention relates to an MIS transistor with self-aligned gate and its manufacturing method. An MIS transistor refers to a structure of Metal-Insulator-Semiconductor type such as, for example, that of MOS transistors (Metal-Oxide-Semiconductor).

In particular the invention relates to the manufacture, on a silicon substrate, of such transistors, capable of functioning in the ultra-high frequency ranges.

The invention can be applied to micro-electronics for manufacturing ultra-high frequency and/or power circuits, for example for producing circuits which can be used in the domain of telecommunications.

STATE OF PRIOR ART

It is known that the components and circuits of the ultra-high frequency type are usually produced on substrates in gallium arsenide (GaAs) or on silicon substrates (Si).

For cost reasons, the circuits produced on gallium arsenide substrates are in general not very complex and do not have a high density of integration. The architecture of these circuits is thus not optimised from the point of view of their compactness.

Document [1] whose references are given at the end of the present description, concerns a method for manufacturing an MIS transistor with self-aligned gate on its source and drain regions.

This method relies on a stage of setting a sacrificial dummy gate for defining the placing of a source region, of a drain region, and the setting of a so-called definitive gate. The implementation of a dummy gate makes it possible to free the definitive gate from thermal treatments linked to the formation of the source and drain regions.

Furthermore, the method of document (1) enables the manufacture of a compact transistor, in particular reducing the contact guard relative to the interconnections made at the gate level.

During continuing research on raising the density of integration of components and circuits, one aim is to reduce the individual size of transistors and more particularly the size of their gate.

When the size of the gate is reduced, there are problems of adjustment of the threshold voltage of transistors and problems of drilling between drain and source.

A rise in the doping density of the channel region located under the gate makes it possible to adjust the threshold voltage and to raise the immunity to drilling between the source and drain zones.

However, the rise in the doping density under the gate is accompanied by a rise in parasite capacities existing between the source and channel on the one hand, and between the drain and channel on the other; and the mobility of the charge carriers is thus reduced.

When the dimensions of the gate are reduced, the doping increases in the channel and it become more difficult to optimise the frequency performances of the components.

One of the limitations of frequency performance is the channel-source or channel-drain parasite capacity.

A description of the state of the art is also given in documents [3] and [4] whose references are provided after the description.

DESCRIPTION OF THE INVENTION

An aim of the present invention is to propose an MIS transistor and its manufacturing method which does not have the limitations mentioned above.

A particular aim of the present invention is to propose such a transistor which can be produced with especially reduced dimensions while still possessing good immunity to drilling.

A further aim of the invention is to be able to adjust the threshold voltage Vt of the transistor to a required value, chosen in function of the supply voltage.

A final aim of the invention is to propose a transistor with low parasite capacities and able to operate at high frequencies.

In order to achieve these aims, the Invention has more precisely the aim of a method for manufacturing an MIS transistor on a semiconductor substrate. The method comprises the following successive stages:

a) formation on the substrate of a layer, called the pedestal layer and, on this layer, formation of a sacrificial dummy gate, the dummy gate being set above a region of the substrate called the channel region.

b) formation in the substrate of source and drain regions, self-aligned on the dummy gate and defining at least partly the channel region, $c_1$) lateral coating of the dummy gate with at least one electrical insulation substance and elimination of the dummy gate to obtain a well above the channel region $c_2$) formation of spacers on the sides of the well, $c_3$) doping of a part of the channel region by ionic implantation in the well, using the spacers as implantation mask, d) formation of a gate in the well, called the definitive gate, separated frown the substrate by a gate insulator layer.

According to the invention, the formation of the definitive gate is preceded by the elimination of at least a part of the pedestal layer located at the bottom of the well and at least a part of the pedestal layer extending under the spacers of the sides of the well, in order to form in this layer at least one recess over a part of the source and drain regions, the definitive gate extending into said space.

Thanks to the spacers equipping the sides of the well, and which are used as implantation mask, the doping of the channel is limited to a central part of the channel without reaching the source and drain regions.

This property makes it possible to adjust the threshold voltage of the transistor, by controlling the doping. It also makes it possible to raise the immunity of the transistor to a drain-source drilling, and above all to reduce the parasite capacities between the channel and the source and drain regions.

It should be noted that the doping stage $c_3$ does not exclude using a substrate which is initially doped. In this case, the doping operation simply leads to a rise in the concentration or modification of the type or profile of doping in the central part of the channel.

Furthermore, thanks to the partial elimination of the pedestal layer under the spacers, the gate extends partly over the source and drain regions. When the source and drain are doped gradually, that is to say with a weakly doped zone turned towards the channel and a more highly doped zone turned away from the channel respectively, the edges of the gate extend as far as above the weakly doped zones. Such an architecture makes it possible to produce a good compromise between reduction of the resistance of access to the channel and reduction of channel-source and channel-drain parasite capacities.

The extension of the overlap of the gate above the weakly doped zones can, for example, be between 0 (when the edge of the gate arrives at the limit of a weakly doped zone) and half the width of the weakly doped zones.

According to a specially advantageous embodiment of the invention, the method can further comprise, before the end of the doping stage $c_3$, the formation of a layer of oxide on the spacers. When these spacers formed on the sides of the well are made of a substance capable of being oxidised, the layer of oxide is preferably formed by oxidation of the spacers.

The aim of the oxide layer is not only to increase the thickness of the spacers on the sides of the well but also to control this thickness precisely in such a way as to define a very thin doped zone at the centre of the channel.

In fact, the extension of the doping zone in the channel depends on the free distance between the surfaces of the facing spacers.

By controlling the extension of the zone in this way, by oxidation of the spacers, it is possible to adjust the threshold voltage Vt of the transistor precisely.

The voltage Vt is chosen such that Vt<Vs/3 for example, where Vs is the supply voltage of the transistor.

According to another preferred embodiment, one can form a dummy gate on a layer, called the pedestal layer, covering the surface of the substrate. Thus one eliminates part of the pedestal layer located at the bottom of the well, before the formation of said definitive gate.

When there is total or partial elimination of the pedestal layer in the well, the lateral spacers formed on the sides of the well also have the function of protecting these sides and in this way avoiding any widening of the well, which would prejudice the compactness of the transistor.

As mentioned above, elimination of the pedestal layer at the bottom of the well can advantageously comprise elimination of at least a part of the pedestal layer extending under the spacers of the sides of the well to form at least one recess over a part of the source and drain regions. The definitive gate which is finally formed then extends into this recess.

Furthermore, the method according to the invention can comprise, before formation of the definitive gate, elimination of the pedestal layer at the bottom of the well and the formation of a layer for insulating the gate.

Since the gate oxide formed at the bottom of the well has a lower thickness than that of the oxide of the pedestal layer, one obtains in fine, a gate with a cross section of an upside-down T.

It can be seen that when the spacers of the lateral sides of the well are oxidised, their superficial oxide layer is also eliminated or breached at the time of elimination (de-oxidisation) of the pedestal layer at the bottom of the well.

Thus, after this stage, and before putting the definitive gate into place, one can form a new oxide layer on the spacers. This measure makes it possible to adjust or exaggerate the upside-down T shape of the gate.

A further aim of the invention is an MIS transistor comprising a channel region in a substrate, as well as source and drain regions arranged on each side of the channel, and a gate set closely above the channel region. According to the invention, the channel has a doped central part between the source and drain regions, and separate from said source and drain regions.

When the channel can be doped overall or on the contrary doped unintentionally, one means by doped central part a part with doping at a higher concentration than the average doping concentration of the channel.

The doping can thus be adjusted, under the gate.

Furthermore, this central part is considered to be separate from the source and drain regions, meaning that a less doped zone or unintentionally doped zone is located respectively between the central part (doped) and each of the source and drain regions.

According to another embodiment, the gate can have a T-shaped cross-section (upside-down) with part of it forming the horizontal bar of the T turned towards the channel and extending partially over the source and drain regions.

Other properties and advantages of the present invention will become clearer by reading the following description, with reference to the drawings in the figures in the appendix. This description is given as a purely illustrative and non-limiting example.

DETAILED DESCRIPTION OF THE METHODS OF IMPLEMENTATION OF THE INVENTION

Figure 1:
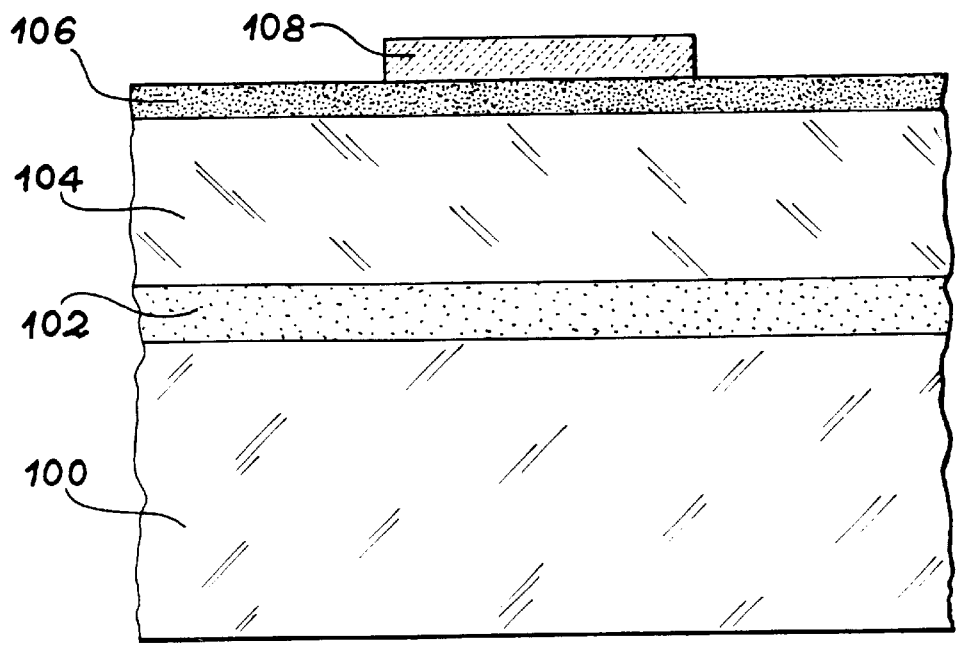
FIG. 1 is a cross-section of a substrate intended for the formation of an MIS transistor and shows a first stage of manufacture of a sacrificial dummy gate.

FIG. 1 shows a substrate of silicon 100 whose surface has been oxidised in order to form a layer 102 of silicon oxide called the pedestal layer.

The pedestal layer 102 is covered with a layer of polycrystalline or amorphous silicon 104 and a layer of silicon nitride 106, in which a dummy gate will be formed later. The thickness of the assembly of layers of silicon 104 and of silicon nitride 106 is for example of the order of 100 to 500 nm.

Reference 108 indicates an etching mask such as for example a photosensitive resin mask, which is formed at the surface of the silicon nitride layer 106.

The etching mask 108 makes it possible to fix the dimensions and the location of the dummy gate.

Figure 2:
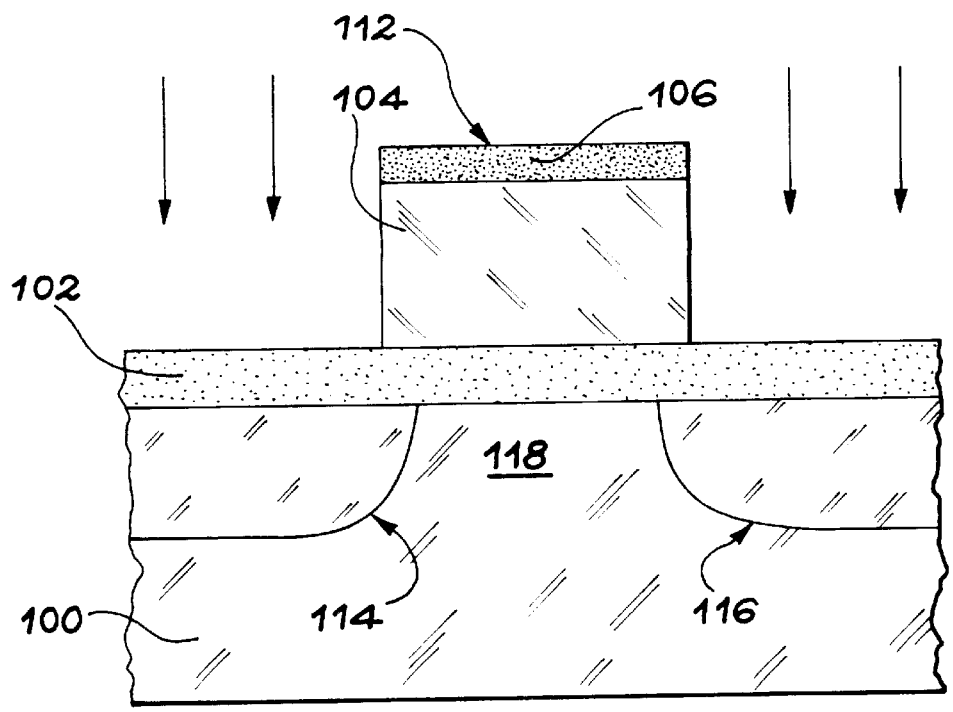
FIG. 2 shows a stage for implantation of source and drain regions in the substrate of FIG. 1.

The dummy gate 112 seen in FIG. 2, is formed by anisotropic selective etching of layers of silicon nitride 106 and silicon 104, according to the pattern defined by the mask 108, with stop at the pedestal layer 102. The etching mask 108 is then eliminated.

The formation of the dummy gate is followed by a first low dose implantation of ions. Depending on whether the transistor to be produced is of the type PMOS or NMOS, the ions are chosen in such a way as to produce zones of p or n conductivity. As an example, at the time of the first implantation, boron ions are implanted dosed at $10^{13}$ to $10^{14}$ cm$^{-2}$ at an energy of 3 to 25 keV for the PMOS. In the case of an NMOS transistor, phosphorus or arsenic is used in the same range of dosing and energy.

The implanted regions, marked by references 114 and 116 constitute respectively the drain and source regions of the transistor. The substrate portion extending between the source and drain regions and located closely under the dummy gate, constitutes the channel 118 of the transistor.

Figure 3:
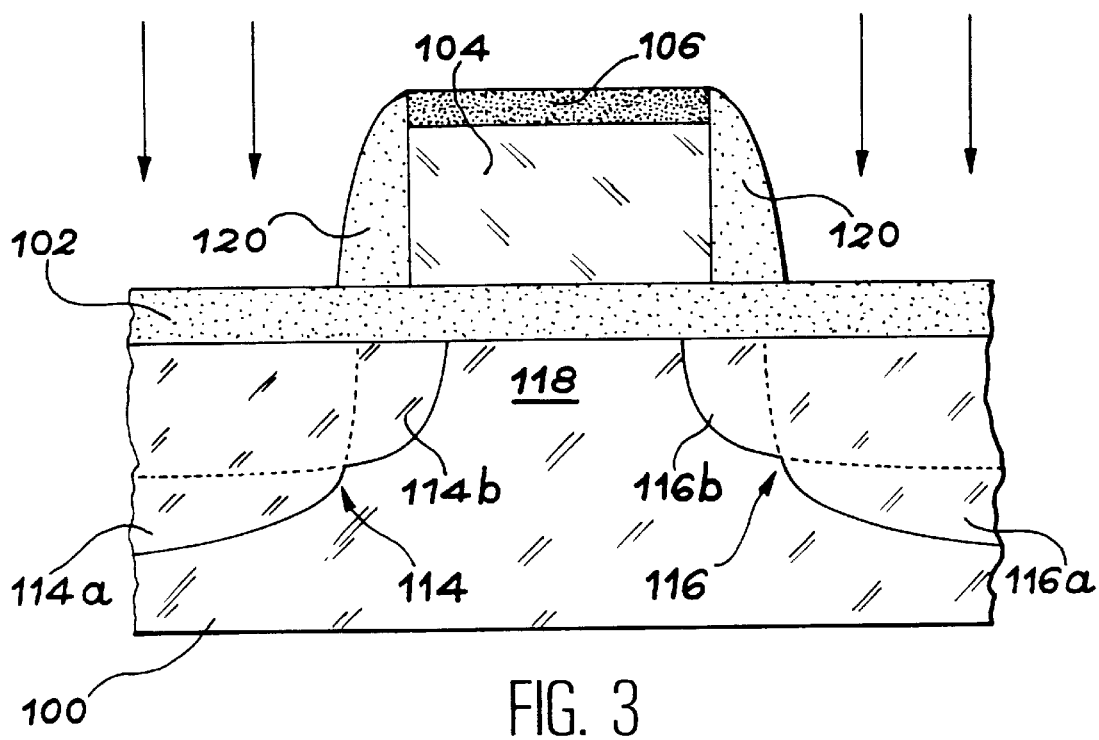
FIG. 3 shows a supplementary stage for implantation of source and drain regions.

In a special embodiment of the transistor, the formation of the drain and source regions can, as shown in FIG. 3, be completed by a second implantation, with a higher dosing, of ions with the same type of conductivity as those of the first implantation.

Before this second implantation, the dummy gate 112 is equipped with lateral spacers 120.

These spacers are formed by a conforming deposit of a layer of silicon oxide then by anisotropic etching of this layer in such a way as to preserve the lateral spacers on the sides of the dummy gate.

The source and drain zones obtained at the end of the second implantation have first parts 114a, 116a of higher concentration and two parts 114b and 116b, under the form of extensions extending further than the first parts in the direction of the channel, and with a lower concentration of doping impurities.

Figure 4:
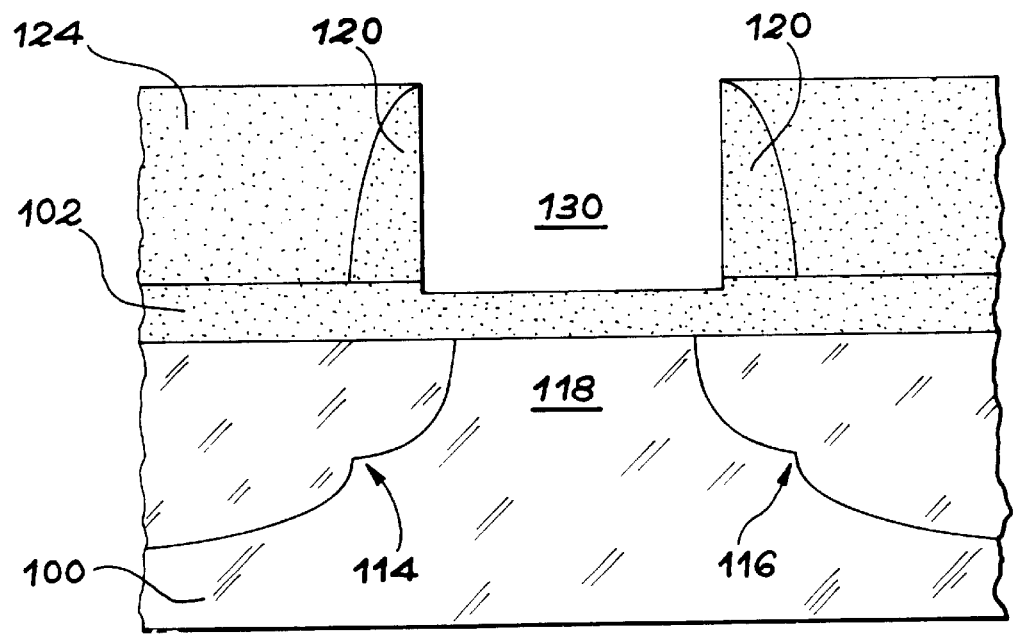
FIG. 4 is a cross-section of the structure after coating and then elimination of the dummy gate.

FIG. 4 shows the formation of a coating layer 124 of the dummy gate.

The coating layer 124 can be formed by a deposit of one or several layers of chosen substances, for example, from among doped silicon oxide, unintentionally doped silicon oxide and borophosphosilicate glass (BPSG).

The coating layer is then flattened and polished (levelled) stopping at the silicon nitride layer of the dummy gate (not shown in FIG. 4).

After levelling, the dummy gate is eliminated so that only the lateral spacers 120 and the coating layer 124 remain at the surface of the pedestal layer. In the rest of the text, the lateral spacers 120 mentioned above will be called "exterior" spacers.

The elimination of the dummy gate makes it possible to form a well 130 with a bottom constituted by the pedestal layer 102 and whose walls or flanks are formed by the "exterior" spacers 120.

A more detailed description of the stages of the method making it possible to attain a structure in conformity with FIG. 4, as well as possible embodiment variants can be found in document [1] cited above.

Figure 5:
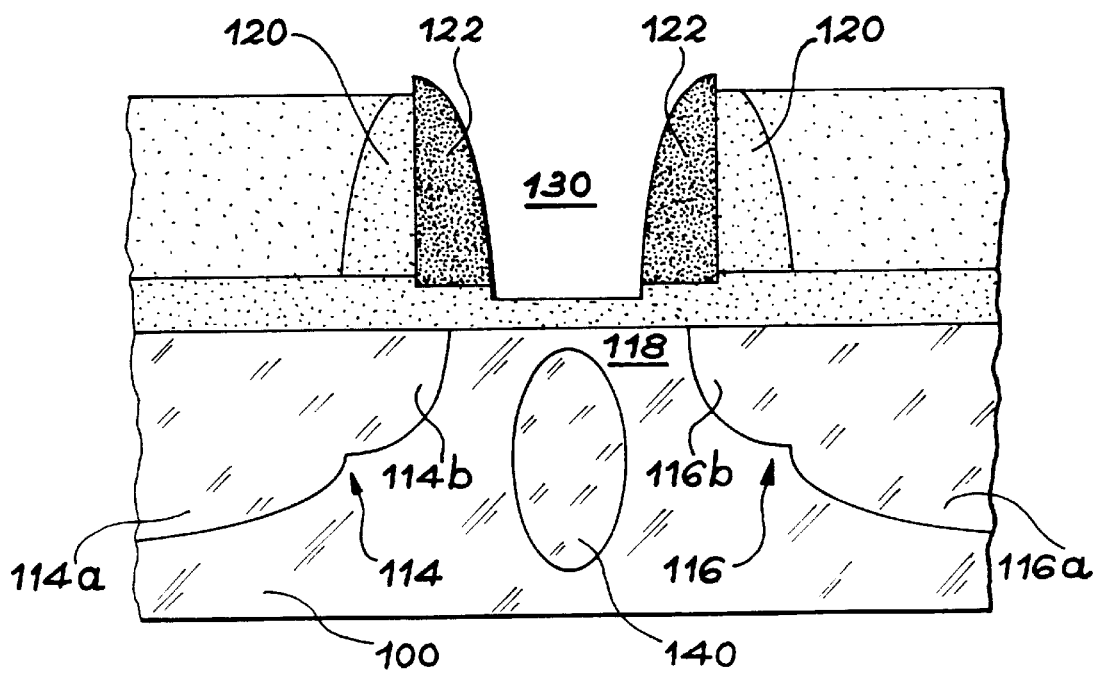
FIG. 5 shows a cross-section of the structure of FIG. 4 prepared for the implantation of a doped zone between the source and drain regions.

The method is continued, as shown in FIG. 5, with the formation of lateral spacers 122 in silicon nitride on the sides of the well 130.

The lateral spacers 122, called "interior" spacers are formed by depositing a layer of silicon nitride which covers the whole of the structure, then by reactive ionic, isotropic and selective etching of the layer so as to conserve only a part of this layer covering the sides (vertical). As a variant, the spacers can also be made of amorphous or polycrystalline silicon.

It is noted that the pedestal layer 102, as well as the coating layer 124 are slightly attacked during this etching resulting from a selectivity of etching of nitride relative to the oxide which is not perfect.

The formation of interior lateral spacers is followed by one or several ionic implantation(s) making it possible to adjust the threshold voltage of the transistors by using the coating layer 124 and the lateral spacers 122 as implantation mask. The implanted ions can be ions of boron or indium for a type P doping or ions of phosphorus or arsenic for type N doping. Possibly, the implantation can be followed by an annealing. An annealing can also be carried out at a stage of oxidation (of the gate) later in the procedure. The implantation takes place across the pedestal layer.

Because of the interior lateral spacers, it is possible, in the channel region, to form a doped zone 140 located closely halfway between the source and drain regions and whose lateral extension does not reach said source and drain regions.

As mentioned above, by doped zone 140 it is understood a zone presenting a higher concentration of doping than the rest of the channel.

The conditions of implantation, that is to say in particular the dosing and the energy, are preferably adjusted on a particular profile of the doped zone extending, for example, from the surface to the substrate volume 100 with a concentration peak located at the centre of the channel 118 at a depth corresponding to the half of said second parts 114b, 116b of the source and drain regions.

As an example, the implantation may be carried out with a boron dosing of 1 to $5.10^{13}$ and an energy of 10 KeV for a depth of junction of the two parts 114b and 116b of the order of 25 nm.

Thanks to the implantation, the transistor is provided with good resistance to drilling, in volume and in surface.

The manufacture of the transistor can be terminated by eliminating the pedestal layer 102 at the bottom of the well, then by putting in place a gate oxide layer and a gate.

These operations are described in more detail with the figures which follow and which illustrate an advantageous improvement of the invention.

According to one embodiment of this improvement, before implantation a superficial oxidation of the silicon nitride of the spacers is carried out in such a way as to transform a superficial layer of silicon nitride into a layer of silicon oxide. This oxide layer is marked with the reference 134 in FIG. 5.

The oxidation has a double function. On the one hand, it makes it possible to transform a part of the nitride of the spacers into oxide so as to be able to etch this part later, at the same time as the oxide of the pedestal layer. On the other hand the oxidation provokes swelling of the spacers (the density of the oxide being lower than that of the nitride). This swelling is used to reduce and to make a fine adjustment to the space remaining between the spacers.

The adjustment of this space allows control of the extension of the doped zone at the moment of implantation.

The oxide layer 134 is produced preferably by the cold oxidation method or by the wet sulpho-oxygenated method. In order to implement cold oxygenation one can refer, for example, to document [2] whose reference is given at the end of the description. These oxygenation processes make it possible to work at relatively low temperatures and thus avoid any involuntary diffusion of the source and drain zones.

According to a variant, the oxide layer can also be formed by deposit, that is to say by adding material.

After forming the oxide layer 134 on the spacers, one proceeds with the implantation of the doped zone 140 in the way described above, using the spacers equipped with the oxide layer as implantation mask.

Figure 6:
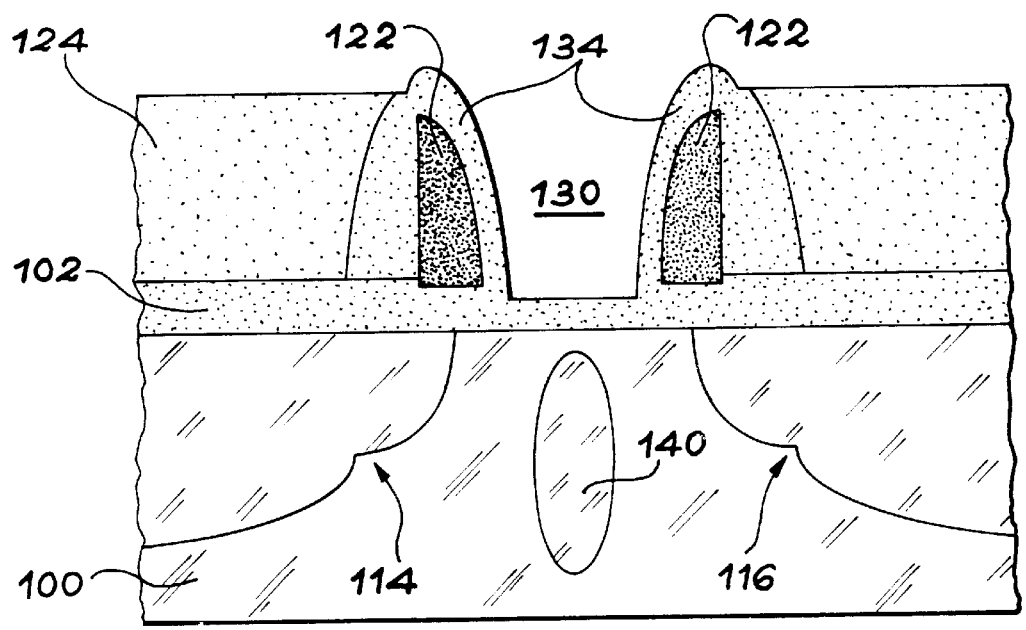
FIG. 6 shows a cross-section, as a variant, of another possibility for preparing the structure for the implantation of the doped zone.

It can be noted in FIG. 6, compared to FIG. 5, that the lateral extension of the doped zone 140 is less.

Figure 7:
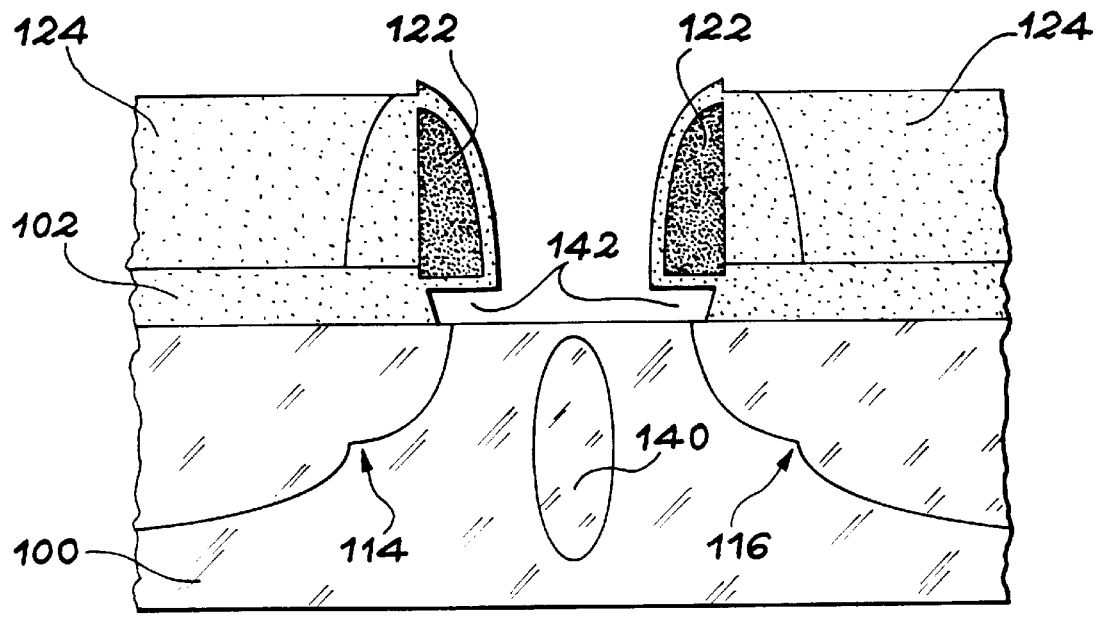
FIGS. 7 and 8 show a cross-section of the preparation stages of the structure of FIG. 6 for setting a definitive gate.

FIG. 7 shows a stage of de-oxidation during which the pedestal layer 102 at the bottom of the well is eliminated. The de-oxidation can take place in a solution of HF diluted in water or buffered HF ($NH_4F$).

During this stage one also eliminates a part of the pedestal layer located under the spacers to form a cavity or recess, 142, extending as far as above the source and drain zones 114, 116.

It can be seen that at least a part of the oxide layer 134 covering the spacers is also eliminated during de-oxidation. This characteristic is particularly advantageous since it encourages the formation of the cavity 142.

Figure 8:
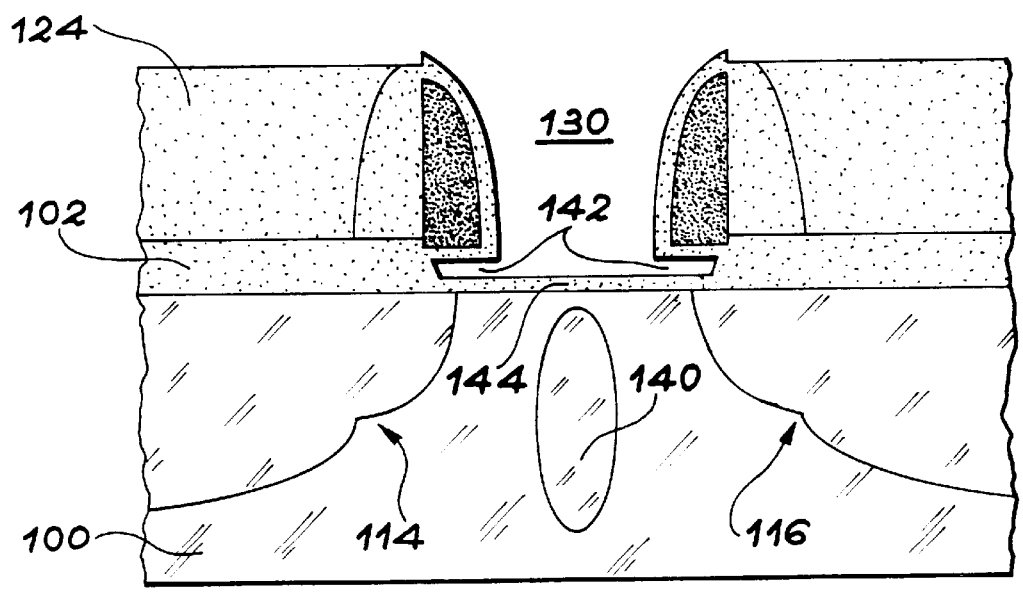

FIG. 8 shows the formation of an insulating gate layer 144 which covers the bottom of the well 130 and extends into the cavity 142.

The gate insulation layer is for example a layer of oxide formed by oxidation or by a chemical deposit method in vapour phase (CVD). This method (CVD) also allows part of the oxide layer 134 to be restored by forming a new layer of oxide on the interior spacers.

According to a variant, one can envisage eliminating only part of the thickness of the pedestal layer at the bottom of the well to avoid formation of the gate insulator layer. However this solution is less advantageous because it does not allow fine control of the thickness of the layer of remaining oxide, and does not encourage production of the cavity 142.

Figure 9:
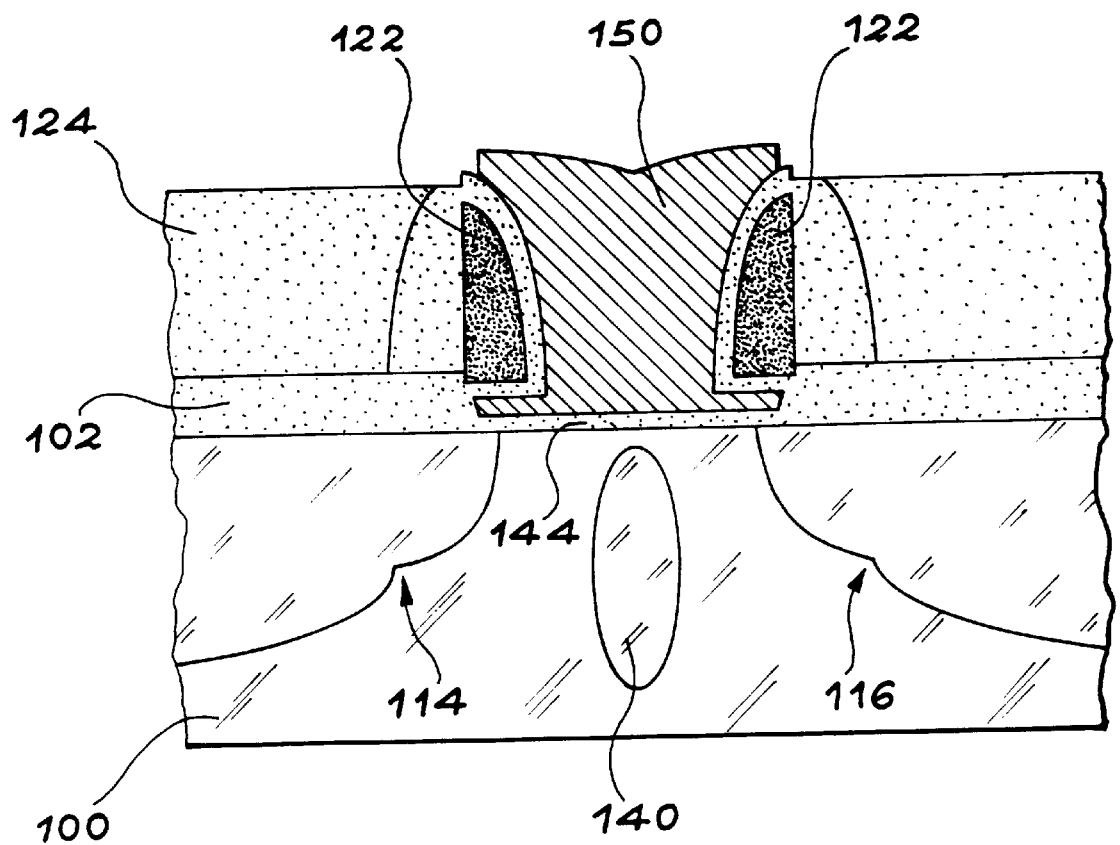
FIG. 9 shows a cross-section of the setting of the definitive gate.

FIG. 9 shows the stage during which the definitive gate 150 is set in place in the well 130.

The substance of the gate is chosen depending especially on the threshold voltage required for the transistor, but also for its conducting properties. In fact the substance of the gate ensures the electrical conduction between the base of the gate in contact with the gate insulator and the upper part likely to come into contact with an interconnecting line (not shown).

The substance of the gate is for example a metal such as TiN, W, Ta, or polycrystalline silicon, deposited for example by CVD.

The gate material extends into the cavity 142 so that in cross-section, the gate has the shape of an upside-down T.

The upper part of the gate, because of the characteristic shape of the lateral spacers which thin out with distance from the substrate, also has a splayed shape which, in cross-section, looks like a T.

This shape facilitates later connections on the gate to interconnect the transistor with other components. In addition, on the surface of the transistor, that is to say over the coating layer 124, the gate substance can be shaped by polishing or etching according to the pattern required. The material of the gate can also be levelled by polishing down to the coating layer 124.

The manufacture of the transistor can be completed by producing contacts on the source and drain regions, through the coating layer and across the pedestal layer. These latter operations are well known in themselves and are not described more fully here.

Figure 11:
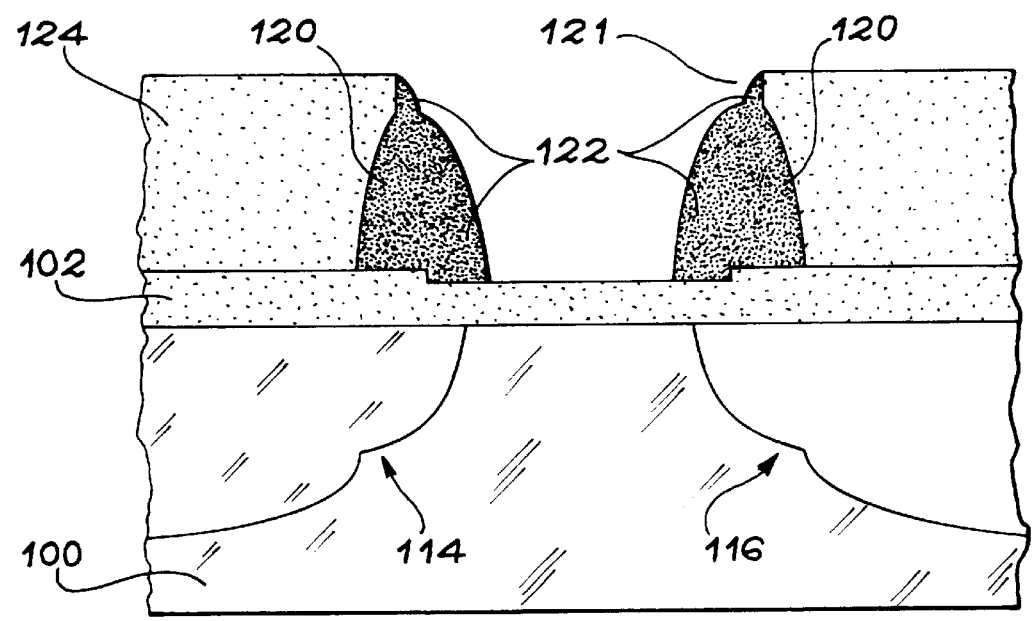

In a complementary way, FIGS. 11 and 12 show a variant of the stage of the method corresponding to the production of the lateral spacers.

In this variant, the exterior spacers 120 and interior spacers 122 are all produced in silicon nitride.

Figure 10:
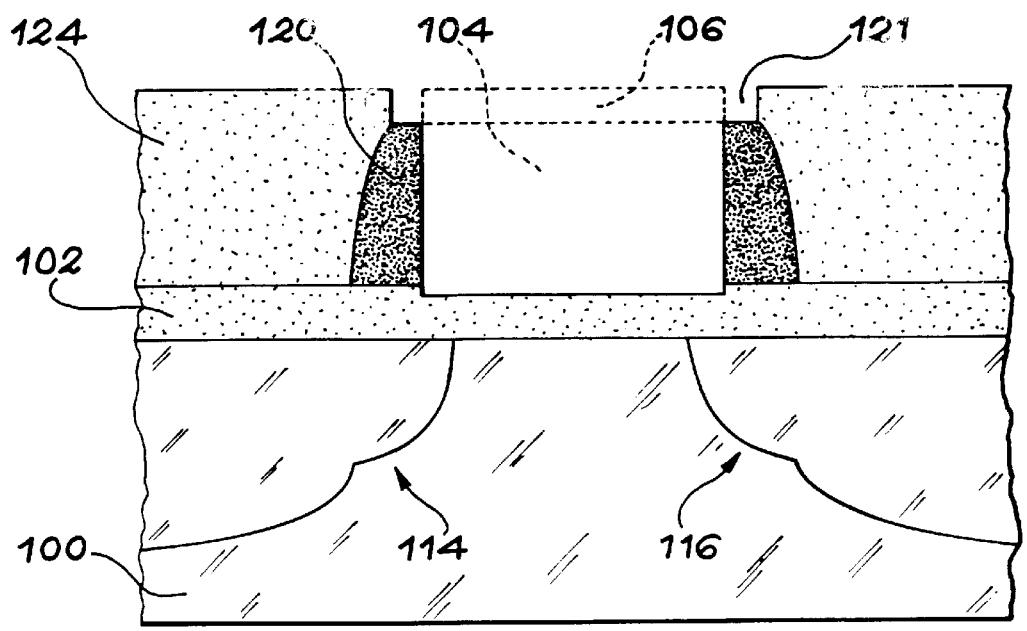
FIGS. 10 and 11 show a cross-section of an embodiment variant of the structure corresponding to FIG. 4.

FIG. 10 shows the structure as obtained after elimination of the dummy gate. As an example, the settings of the layer of silicon 104 and the layer of silicon nitride 106 are represented by dotted lines.

At the top of the exterior spacers 120 one can see a discontinuity 121 of the coating layer 124.

This discontinuity comes from the combined effects of a parasitic etching of the coating layer during the elimination (by etching) of the dummy gate and an etching of the upper part of the exterior spacers 120 (in nitride) during elimination of the layer of silicon nitride 106 of the dummy layer. In fact, during the elimination of this layer, all the exposed nitride parts undergo etching.

FIG. 11 shows the formation of the interior lateral spacers 122.

These rest against the exterior spacers 120 and against the edge of the coating layer 124, at the level of the discontinuity 121.

The subsequent operations remain identical to those already described. This particular embodiment makes it possible to accentuate the T shape of the part of the definitive gate which will finally be formed in the well.

Thus, also taking into consideration the subsequent stages already described, the gate finally has a cross-section shaped in a double T (T and upside-down T) also called an I shape.

REFERENCES

1. FR-A-2 757 312
2. "Sealing Silicon Nitride Removal in SILO Field Isolation for Submicron Technologies" by S. Deleonibus and coll. J. Electrochem. Soc., vol. 138, No. 12, December 1991, p. 3739–3742.
3. U.S. Pat. No. 5,750,430
4. U.S. Pat. No. 5,576,227

What is claimed is:

1. A method of manufacturing an MIS transistor on a semiconductor substrate comprising the steps of:

a) forming a sacrificial dummy gate (112) on a pedestal layer (102) formed on a substrate (100), the dummy gate being set above a channel region (118) of the substrate;

b) forming source and drain regions (114, 116) in the substrate such that they are self-aligned to lateral edges of the dummy gate and define, at least in part, the channel region;

$c_1$) coating the lateral edges of the dummy gate with at least one electrical insulation substance and removing the dummy gate to obtain a well (130) above the channel region;

$c_2$) forming interior lateral spacers (122) on the sides of the well;

$c_3$) doping a part (140) of the channel region by ionic implantation in the well, using the interior lateral spacers as an implantation mask;

d) forming a definitive gate (150) in the well, the definitive gate separated from the substrate by a gate insulator layer, wherein the step of forming the definitive gate is preceded by a step of removing at least a part of the pedestal layer located at the bottom of the well and at least a part of the pedestal layer (102) extending under the spacers of the sides of the well, to form at least one recess (142) above a part of the source and drain regions, the definitive gate extending into said at least on recess.

2. The method according to claim 1, wherein the step of forming the source and drain regions comprises the steps of:

performing a first ionic doping implantation using the dummy gate (112) as an implantation mask, forming exterior lateral spacers (120) on the flanks of the dummy gate, performing a second ionic doping implantation using the dummy gate equipped with the exterior lateral spacers as an implantation mask.

3. The method according to claim 1 wherein before terminating step $c_3$, a layer of oxide (134) is formed on the interior lateral spacers.

4. The method according to claim 3 wherein the oxide layer (134) is formed by cold oxidation of exposed sides of the interior lateral spacers.

5. The method according to claim 2 wherein the exterior lateral spacers (120) and the interior lateral spacers (122) are made of the same substance.

6. The method according to claim 1, further comprising, prior to the step of forming the definitive gate, the steps of: removing a portion of the pedestal layer at the bottom of the well and forming the gate insulator layer (144).

7. The method according to claim 1 wherein after elimination of said part of the pedestal layer and before setting the definitive gate in place, a new oxide layer is formed on the sides of the interior lateral spacers.

* * * * *